SOLID STATE ELECTRICAL CIRCUIT COMPONENT

Filed Feb. 2, 1961 3 Sheets-Sheet 1

INVENTOR
LEO ESAKI

BY Alvin J. Riddles
ATTORNEY

Jan. 11, 1966 L. ESAKI 3,229,172

SOLID STATE ELECTRICAL CIRCUIT COMPONENT

Filed Feb. 2, 1961 3 Sheets-Sheet 3

Jnited States Patent Office 3,229,172

Patented Jan. 11, 1966

3,229,172

SOLID STATE ELECTRICAL CIRCUIT COMPONENT o Esaki, Poughkeepsie, N.Y., assignor to International Business Machines Corporation, New York, N.Y., a corporation of New York Filed Feb. 2, 1961, Ser. No. 86,809
11 Claims. (Cl. 317—234)

This invention relates to elements for use in electrical ·cuits; and, in particular, to an element exhibiting an :ctrical preformance resulting from an interaction of agnetic and quantum mechanical tunneling properties.

As the art of electrical circuit component development s advanced, there has been increased attention directed the mechanism by which electrical conduction through e component takes place, to the controls which influence e operation of the conduction mechanism and to the anifestation of the electrical current flow through the vice. It has been the desire in the art to develop a com- ıent wherein the conduction mechanism is reliable and ntains no inherent delay, where there are a plurality of ntrolling parameters capable of influencing the mech- ism and where there are a plurality of manifestations the current condition of the device. In other words, e development of components has been oriented in a rection such that the mechanism by which current rough the component changes is inherently fast, that ere be several ways to control the current flow and that ere be several ways to sense the condition existing in e component.

Recently in the art, the quantum mechanical tunneling particles through a potential barrier has been found to an advantageous mechanism for varying the electrical ırrent through a component and components have ap- ared in the art wherein this mechanism has been em- oyed in connection with cryogenic and certain semicon- ıctor properties. Primarily, these device have involved :ctron tunneling through an insulating barrier separat- g two cryogenic electrodes.

As background in the art of devices employing quantum echanical tunneling through an insulating barrier as a echanism of conduction, the following literature has en published:

Physical Review Letters, vol. 5, No. 10, November 15, '60, entitled, "Direct Measurement of the Superconduct- g Energy Gap," by James Nicol, Sidney Shapiro and ıul H. Smith.

Physical Review Letters, vol. 5, No. 10, November 15, '60, entitled "Electron Tunneling Between Two Super- nductors," by Ivar Giaever.

Physical Review Letters, vol. 5, No. 4, August 15, 1960, titled, "Energy Gap in Superconductors Measured by ectron Tunneling," by Ivar Giaever.

Business Week, November 26, 1960, an article entitled, 'ubes, Then Transistors, Now . . . ."

Control Engineering, January 1961, page 32, a column titled, "Cold Tunneling Device Is Newest Component."

In devices of this type seen heretofore in the art, the :chanism of conduction has been inherently fast and a rtain amount of control of the current flow has been ailable through the cryogenic properties of the elec- ›des of the device.

What has been discovered is an electrical circuit com- ıent having greater control of the current therethrough d exhibiting a wider variety of manifestations of its con- tion than circuit elements available heretofore in the t. The circuit component of this invention employs e quantum mechanical tunneling of electrons through an sulating barrier as the current conduction mechanism d employs a conductor having the property that there are energy states adjacent to the Fermi level immediately available as one electrode and a ferromagnetic material as the other electrode. The electrical circuit component of this invention has the property that its high speed quantum mechanical tunneling current mechanism is subject to influence by both the magnetic condition of the ferromagnetic electrode and by temperature, thus yielding a high degree of versatility and utilization while at the same time taking full advantage of the speed of the tunneling mechanism and achieving these features with simplicity of structure.

It is an object of this invention to provide an improved solid state electrical circuit component.

It is another object of this invention to provide a magnetic solid state circuit element controlled by a quantum mechanical tunneling current.

It is another object of this invention to provide a solid state quantum mechanical tunneling electrical circuit element controllable by both magnetic and temperature properties.

It is another object of this invention to provide a magnetically sensitive quantum mechanical tunneling circuit device.

It is another object of this invention to provide a temperature sensitive quantum mechanical tunneling circuit device.

It is another object to provide a high speed circuit element responsive to interdependent control by a plurality of properties and which has sufficiently small physical dimensions as to be compatible with the miniaturization of circuitry currently being studied in the art.

The foregoing and other objects, features and advantages of the invention will be apparent from the following more particular description of a preferred embodiment of the invention, as illustrated in the accompanying drawings.

Figure 1:
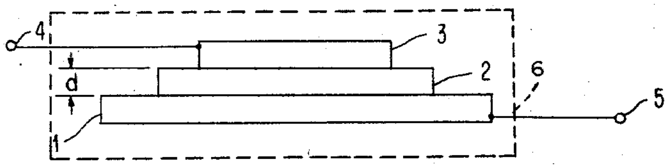
FIG. 1 is a view of the structural features of the circuit component of the invention.

Referring now to FIG. 1, the electrical circuit component of the invention is made up of a conducting member 1 which serves as a first electrode. The electrode 1 is a non-magnetic material that serves as a conductor and its primary requirement is that it have exlectron energy states adjacent to the Fermi level immediately available. The electrode 1 is generally a metal, for example, aluminum, but may be made of many materials which will satisfy the criterion of having energy states adjacent to the Fermi level immediately available for example, a degenerately doped semiconductor material.

A potential barrier 2 is provided on the electrode 1. The potential barrier 2 may be a condition establishing a space charge. The barrier 2 has been schematically shown in FIG. 1 as an independent member although the presence of the potential barrier is the governing criterion. The barrier 2 may be any insulating material or fairly pure semiconductor material having a forbidden energy gap and having a thickness, showing in FIG. 1 as a dimension "$d$," such that the probability of tunneling will be a usable value, as will be later described. The barrier 2 may also be a contact potential producing a potential barrier due to the space charge. Again, there are many materials and structures which will satisfy these criteria and a convenient barrer 2 material for an electrode of aluminum, as above described, is the material aluminum oxide ($Al_2O_3$) which can be placed on the aluminum electrode 1 in a thickness of approximately 20 to 30 Angstrom units (A.) for the dimension "$d$" which is a useful value for tunneling probability. The factors governing the thickness "$d$" will be discussed in detail later but for practical purposes it may be considered that the dimension "$d$" should be within the vicinity of 20 to 30 Angstrom units.

Over the potential barrier 2 a ferromagnetic material electrode 3 is placed. A ferromagnetic material may be considered to exhibit strong magnetization of the familiar type exhibited by the element iron, for example, nickel, iron, cobalt and the ferromagnetic alloys such as nickel-iron. The ferromagnetic electrode 3 may exhibit a remanent hysteresis characteristic and may be applied in the form of a thin film having a thickness near that of a magnetic domain. Appropriate electrical connections 4 and 5 may be made respectively to the electrodes 3 and 1 for circuit connection purposes well-known in the art.

In the device of FIG. 1 both electrodes 3 and 1 have electrons in the vicinity of the Fermi level and the electrodes are separated by a potential barrier 2 so that when a bias is applied between the electrodes 3 and 1, the bias operates to cause the overlapping of energy states essential to permit the tunneling mechanism to be effective. It has been discovered that the device of this invention exhibits sensitivity to the effects of magnetic field and of temperature and further these effects are exhibited in a temperature range compatible with most cryogenic materials, that is, in the temperature range below that of liquid helium as provided by cryostat 6. In addition, when the ferromagnetic electrode 3 is a thin film of material having a remanent hysteresis charactristic and near a magnetic domain in thickness; a tunneling current, having a predominance of electron spins of one sign, couples more effectively with the material for switching purposes.

Further, as a result of the unique properties of applicant's invention, since the barrier current characteristic is dependent upon the state of magnetization of the ferromagnetic electrode 3 such device may be used for the sensing of the state of a magnetic element by applying the barrier 2 and the conducting electrode 1 as coatings on the magnetic element or vice versa. Where the magnetic element 3 involves magnetic domain wall switching, passage of a domain wall, also referred to in the art as a "Bloch wall," adjacent to the barrier contact will be reflected in the tunneling current.

What has been described thus far is the physical structure of a high speed and extremely versatile solid state electrical circuit element wherein the mechanism of conduction is inherently fast, where control of the mechanism is interdependently accomplished by magnetic and temperature properties and where the condition of the component may be sensed in a number of ways, and, as a result of the special character of the current tunneling through the barrier, the current couples with the ferromagnetic electrode most effectively and the magnetic remanent state of the ferromagnetic electrode can be controlled with this current.

The circuit element of this invention may be made by successive metal evaporations and oxidations. The physical area, series resistances and currents involved are quite small so as to be compatible with the high microcircuitry packing densities currently under study in the art. As a typical example, the device of the invention as illustrated in FIG. 1 may be prepared by vapor depositing a layer of aluminum 1 on a supporting substrate, such as glass, in a vacuum. The aluminum is then oxidized in air for a few minutes at room temperature to form the barrier 2, and then, the ferromagnetic layer 3 of nickel is vapor deposited. The thickness of the oxide layer separating the aluminum 1 and nickel 3 for a good tunneling probability is preferentially in the vicinity of 20 to 30 Angstrom units in thickness. The active area of the device is approximately 0.005 x 0.005 inch.

The sensitivity of the component of the invention to magnetic fields may be altered by heat treatment and may be improved by prolonged exposure to heat above room temperature in excess of one hour.

In order to aid in practicing the invention and to provide a starting place for one skilled in the art in practice of this technology, the following discussion of the tunneling mechanism is provided for the condition that the barrier be a separate high resistivity member.

In a device of the invention, the tunneling probability across a thin potential barrier from one electrode to another for an electron of energy E may be expressed by the formula:

*Equation 1*

$$P=P_0e^{\left(-2\int_b^a \frac{\sqrt{2m(V-E)}}{\hbar}dx\right)}$$

Figure 2:
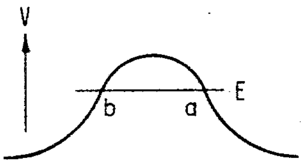
FIG. 2 is a graph schematically illustrating the limits of tunneling probability through a potential barrier.

Where:
$P_0$=constant determined by the area.
$\hbar$=Dirac's $h$
$d$=thickness of insulating barrier
$E$=electron energy
$V$=barrier potential
$m$=effective mass of the tunneling electron and the integral is taken between the limits "$a$" and "$b$" as shown in FIG. 2.

Figure 3:
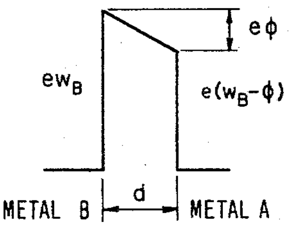
FIG. 3 is a schematic illustration of an energy diagram of a metal to metal barrier tunneling device.

When two metals "A" and "B" are separated by a thin insulating barrier of thickness "$d$," an energy diagram is schematically shown in FIG. 3 for the condition of no bias voltage.

Where:
$\phi$ is the contact potential between the two conducting metals; and,
the Fermi levels of the metals "B" and "A," which may correspond to the electrodes 1 and 3 of the invention as shown in FIG. 1, are below the bottom of the conduction band of the barrier material 2 by the energy differences $eW_B$ and $e(W_B-\phi)$ respectively.

In this situation, the tunneling current I at an applied voltage V may be expressed as:

*Equation 2*

$$I=AVP$$

Where:
A may be a sufficiently smoothly and slowly varying function of V.

Calculations of the tunneling probability for several conditions would then be expressed as follows:

*Equation 3*

$$I=AVe^{\left(\frac{-2\sqrt{2mqW_B}}{\hbar}d\right)}$$

Where:
$q$ is the electronic charge.

For the condition that $W_B >> V+\phi$ and where the current is fairly proportional to the applied voltage.

*Equation 4*

$$I=AVe^{\left(\frac{-4\sqrt{2mqd}}{3\hbar(V+\phi)}\left(W_B^{\frac{3}{2}}-(W_B-(V+\phi))^{\frac{3}{2}}\right)\right)}$$

For the condition that $W_B>V+\phi$

*Equation 5*

$$I=AVe^{\left(\frac{-4\sqrt{2mqd}}{3\hbar(V+\phi)}W_B^{\frac{3}{2}}\right)}$$

For the condition $W_B<V+\phi$ the current increases very rapidly with the voltage increase.

Figure 4:
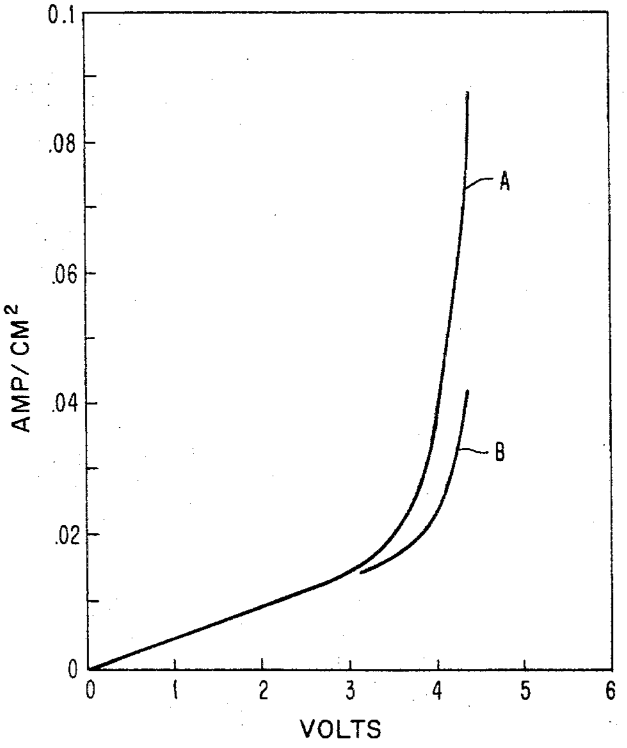
FIG. 4 is a graph showing a difference in tunneling current for different directions of current flow in the component of the invention.

In such a barrier shape as shown in FIG. 3, the metal "A" under positive potential is the easy flow direction. A circuit component of Al, $Al_2O_3$ and Ni having a barrier of approximately 30 A. exhibits in $I/V$ characteristic as shown in FIG. 4. This I/V characteristic is almost independent of temperature from liquid Helium to room temperature. Two curves are shown; the first labelled "A" is plotted for the condition where the electrode 1 is positive and "B" where the ferromagnetic electrode 3 is positive. The observed voltage differences between two curves of opposite current direction has approximately 0.4 volt for equivalent currents and therefore $\phi$ in FIG. 3 may be estimated to be 0.2 volt.

Figure 5:
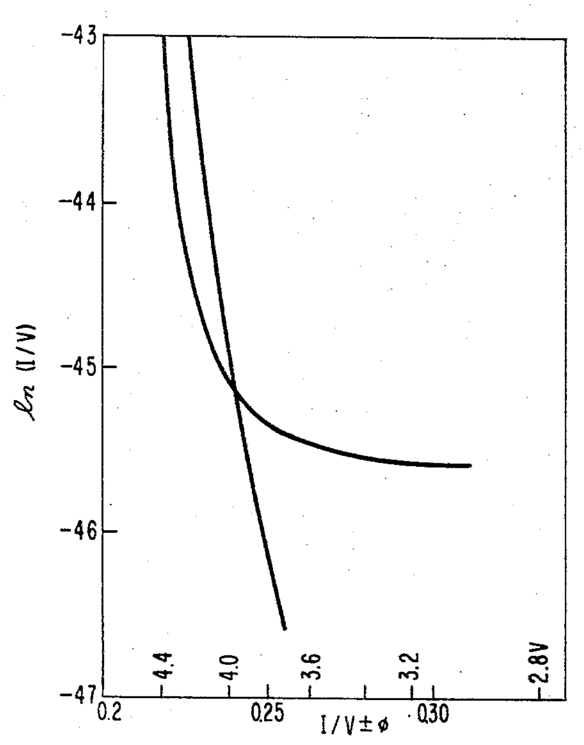
FIG. 5 is a graph schematically illustrating a value of a contact potential shown in FIG. 3.

Referring next to FIG. 5, the natural logarithm ln $(I/V)$ vs. $I/V+\phi$ is plotted. Positive and negative signs before $\phi$ are indicative of easy and hard flow, respectively. It should be noted that the ln $(I/V)$ is fairly constant over the low voltage, which changes gradually and then rapidly with the increase of the applied voltage; thus, the response of the element of the invention is in agreement with that predicted by Equations 3, 4 and 5. The exponent in Equation 5 is numerically calculated to be $-200/V+\phi$ from the values for thickness of the barrier "$d$" at $30\times10^{-8}$ cm. or 30 Angstrom units. $W_B$ is calculated to be 4½ volts. The free electron mass is "$m$."

Figure 6:
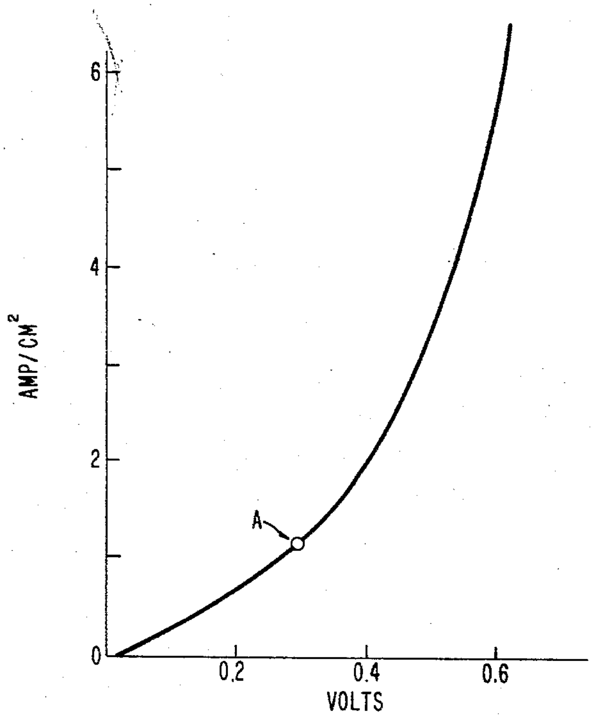
FIG. 6 is an *I/V* curve of an aluminum, aluminum oxide, nickel component of the invention.

Referring next to FIG. 6, the $I/V$ characteristic for an Al, $Al_2O_3$, Ni device having a barrier approximately 20*a*. is shown. It will be noted from comparison with FIG. 4, that a much higher current density is handled by a thinner barrier.

When a magnetic field is applied to the structure of FIG. 1, under a bias, for example at 0.26 volt, a change of voltage takes place. This voltage change is illustrated in FIG. 7, at a constant current condition under the influence of a magnetic field.

Figure 7:
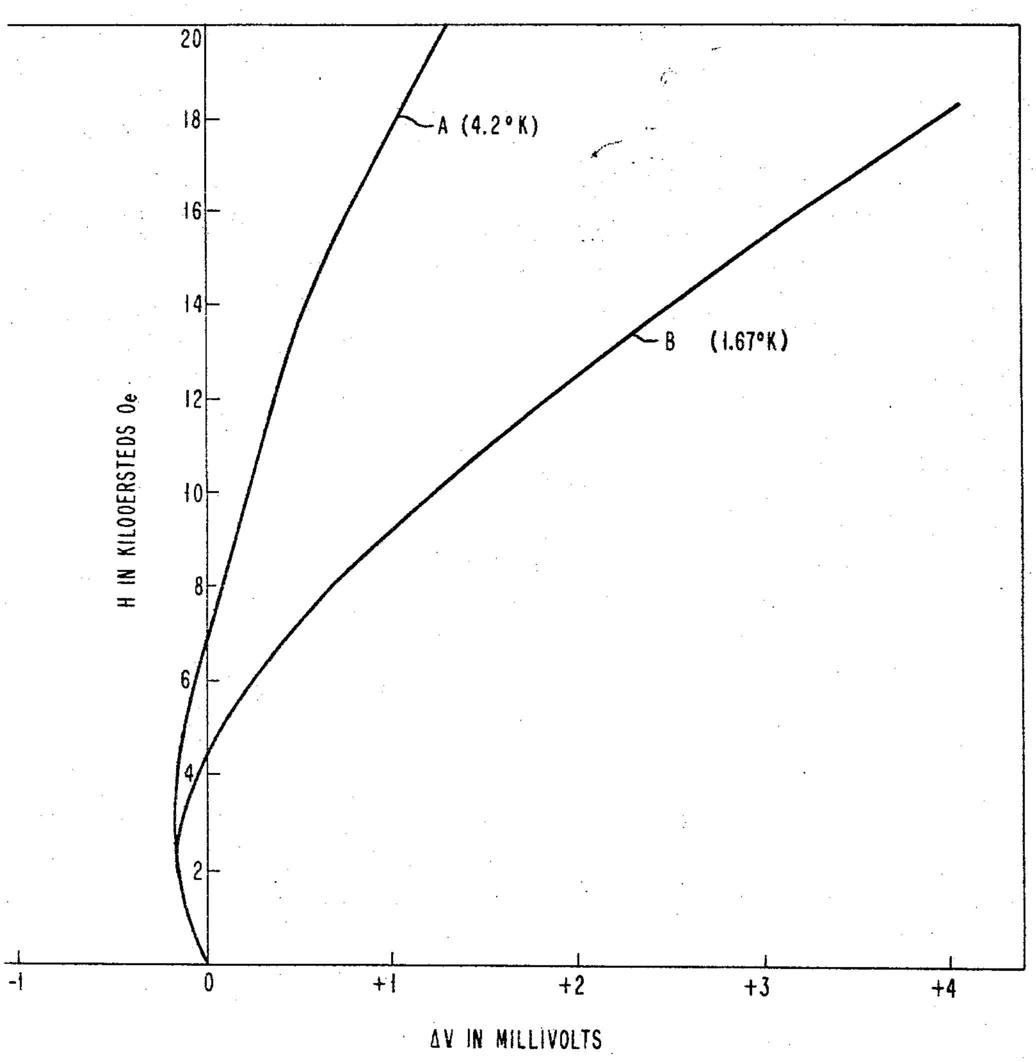
FIG. 7 is an illustration of the temperature and magnetic field dependence of the component of the invention.

Referring next to FIG. 7, curve "A" indicates the response at the temperature of 4.2° Kelvin (K.) and curve "B" represents the performance at 1.67° K. It may be observed that there are two kinds of magnetic effects. The first is an increase in conduction in response to relatively weak magnetic fields as may be seen from the fact that the voltage across the sample increases from the origin to approximately 2 kilo oersteads. This increase in conduction stops at a value which corresponds very closely to the saturation of the ferromagnetic electrode 3. The second magnetic effect is a decrease in conduction for a strong magnetic field. This effect is unchanged in either direction of the magnetic field and these effects are understandably larger for longitudinal magnetic fields and are slightly reduced for transverse magnetic fields. As may be seen from the separation between the curves "A" and "B," the decrease in conduction for strong magnetic fields is highly temperature dependent and is especially strong at temperatures compatible with cryogenic equipment in the vicinity of 2° K.

Thus, it may be seen that substantial versatility of circuit performance of the circuit element of FIG. 1 may be achieved in that under the conditions of a constant current there is first small negative voltage change and current flow increase with increase of magnetic field, and then, there is a larger positive voltage change. The negative voltage change is essentially independent of temperature whereas the positive voltage change is highly dependent upon temperature and the turn around from negative to positive occurs in the vicinity of saturation of the magnetic material.

The above discussion with respect to the probability of tunneling is based upon certain assumptions such as a uniform metal to insulator barrier. It may be seen from Equations 3, 4 and 5 that small change in thickness "$d$" results in a large change in tunneling current. Further, in practice, there may be non-uniform patches which may result in causing the tunneling through only a fraction of the area.

What has been described is a solid state electrical circuit element wherein the current change through the element takes place as a result of the mechanism of quantum mechanical tunneling and the control on the mechanism is exercised by the thermal and magnetic properties of the electrodes that form a portion of the element.

While the invention has been particularly shown and described with reference to a preferred embodiment thereof, it will be understood by those skilled in the art that the foregoing and other changes in form and details may be made therein without departing from the spirit of the invention.

What is claimed is:

1. An electrical circuit component comprising a first conductive member and a second member formed of ferromagnetic material and having a magnetic state, said members being separated by a thin insulating barrier, said insulating barrier being of a thickness in the order of 20 A. to 30 A. to support conduction by electron tunneling when bias is applied between said members, and means for applying said bias between said members.

2. An electrical circuit component as defined in claim 1 wherein said first member is formed of a metal.

3. An electrical circuit component as defined in claim 1 wherein said first member is a metal and said thin insulating barrier comprises an oxide layer of said metal.

4. An electrical circuit component as defined in claim 1 wherein said first member is formed of degenerately doped semiconductor material.

5. An electrical circuit component as defined in claim 1 wherein said thin insulating barrier is formed of substantially pure semiconductor material.

6. An electrical circuit component as defined in claim 1 wherein said second member exhibits a remanent hysteresis characteristic.

7. An electrical circuit component as defined in claim 1 further including means for maintaining said first and second members and said thin insulating barrier at a temperature below that of liquid helium.

8. An electrical circuit component comprising a thin layer of aluminum and a thin layer of nickel separated by a thin layer of aluminum oxide, said thin layer of aluminum oxide having a thickness between 20 A. and 30 A.

9. An electrical circuit component comprising in combination a conductive member and a ferromagnetic member separated by a thin insulating barrier, said insulating barrier being of a thickness in the order of 20 A. to 30 A. to support conduction by tunneling when bias is applied between said members, said ferromagnetic member being formed of a material selected from the group including nickel, iron, and cobalt.

10. An electrical circuit component comprising in combination a conductive member and a ferromagnetic member separated by a thin insulating barrier, said thin insulating barrier being of a thickness in the order of 20 A. to 30 A. to support conduction by tunneling when bias is applied between said members, said ferromagnetic member being formed of an alloy material.

11. An electrical circuit component comprising a first thin film metallic electrode and a second thin film electrode formed of ferromagnetic material and exhibiting a remanent hysteresis characteristic, said first and second electrodes being separated by a thin insulating barrier of a thickness in the order of 20 A. to 30 A. to support conduction by tunneling between said first and said second electrodes, means for applying a bias between said first and said second electrodes to support conduction by tunneling through said insulating barrier to control the remanent state of said second electrode.

References Cited by the Examiner

UNITED STATES PATENTS

| | | | |
|---|---|---|---|
| 2,180,159 | 11/1939 | Michaelis | 317—234 |
| 2,221,596 | 11/1940 | Lorenz | 317—241 |

| | | | |
|---|---|---|---|
| 2,791,758 | 5/1957 | Looney | 317—235 |
| 3,024,140 | 3/1962 | Schmidlin | 317—234 X |
| 3,056,073 | 9/1962 | Mead | 317—234 |
| 3,116,427 | 12/1963 | Giaever | 307—88.5 |

OTHER REFERENCES

"Electronics," vol. 33, No. 21, May 20, 1960, 2 pages, 104 and 106.

JOHN W. HUCKERT, *Primary Examiner.*

SAMUEL BERNSTEIN, DAVID J. GALVIN, *Examiners.*